United States Patent
Yamashita

[19]

[11] Patent Number: 5,969,530
[45] Date of Patent: Oct. 19, 1999

[54] CIRCUIT BOARD INSPECTION APPARATUS AND METHOD EMPLOYING A RAPIDLY CHANGING ELECTRICAL PARAMETER SIGNAL

[75] Inventor: Munehiro Yamashita, Uji, Japan

[73] Assignee: Nidec-Read Corporation, Kyoto, Japan

[21] Appl. No.: 09/032,147

[22] Filed: Feb. 27, 1998

[30] Foreign Application Priority Data

Feb. 28, 1997 [JP] Japan ................................ 9-046127

[51] Int. Cl.⁶ ............................................. G01R 31/02
[52] U.S. Cl. ........................ 324/537; 324/523; 324/754
[58] Field of Search ................................. 324/522, 523, 324/527, 537, 754, 761

[56] References Cited

U.S. PATENT DOCUMENTS

| | | | |
|---|---|---|---|
| 5,138,266 | 8/1992 | Stearns | 324/537 |
| 5,359,291 | 10/1994 | Dommerich, III | 324/523 |
| 5,570,027 | 10/1996 | Stans et al. | 324/523 |
| 5,696,451 | 12/1997 | Keirn et al. | |
| 5,736,862 | 4/1998 | Hamblin | 324/537 |
| 5,744,964 | 4/1998 | Sudo et al. | 324/537 |
| 5,844,199 | 12/1998 | Iino et al. | 324/523 |

FOREIGN PATENT DOCUMENTS 4-244976 A1  9/1992  Japan.
7-146323   6/1995  Japan.

*Primary Examiner*—Diep N. Do
*Attorney, Agent, or Firm*—McCormick, Paulding & Huber LLP

[57] ABSTRACT

An inexpensive and reliable circuit board inspection apparatus and method requires only a short inspection time and is applicable to a densely wired circuit board. A constant voltage E is applied to a switch section SW1 from a signal source 46. A computer 44 turns on a switch section SW2 and then turns the switch section SW1 on. An equivalent circuit is then closed to cause a current (i) to flow therethrough, thereby generating a voltage Vx that is input to an amplifier 74. After the voltage Vx has been amplified by the amplifier 74, its maximum value is detected and held by a peak hold circuit 76. Based on the maximum value, the computer 44 determines the continuity of a printed pattern on a circuit board 32. The voltage Vx input to the amplifier 74 exhibits the maximum value nearly simultaneously with the activation of the switch section SW1. Thus, detection of the maximum value and continuity of the printed pattern can be determined in a very short time.

23 Claims, 14 Drawing Sheets

CIRCUIT BOARD INSPECTION APPARATUS AND METHOD EMPLOYING A RAPIDLY CHANGING ELECTRICAL PARAMETER SIGNAL

FIELD OF INVENTION

The present invention relates to a circuit board inspection apparatus and a method for the inspection of the continuity of wiring formed on a circuit board.

BACKGROUND OF THE INVENTION

Contacting probes with both ends of a printed pattern is one of the methods for inspecting the continuity of the pattern on a printed circuit board. Continuity of the printed pattern can be inspected by checking whether a predetermined current flows when a voltage is applied between the probes.

This method, however, is difficult to apply to a pad section with a fine pitch in which the ends of adjacent printed patterns are very close to each other. That is, probes compatible with fine pitches are generally expensive and a technique for aligning probes with a substrate very accurately must be used during inspection. In addition, since the probes contact the pads, the latter may be damaged.

One inspection method which attempts to solve this problem uses anisotropic conducting rubber instead of the probes, Japanese Patent Application Laid Open No. 61-62877. This method enables the continuity of a printed pattern with a fine-pitch pad section to be inspected without using expensive probes compatible with the fine pitches and without damaging the pads. With the method using anisotropic conducting rubber as illustrated in FIG. 14, however, pressing the rubber 2 against a circuit board 8 may not result in the bottom surface 2a of the rubber 2 abutting the top surface 4a of pad 4 if there is a resist 6 having a top surface 6a significantly above the top surface 4a of the pad 4. This of course results in poor contact during inspection.

Other methods attempting to solve this latter problem use a non-contact sensor, Japanese Patent Applications Laid Open Nos. 4-244976 an 58-38874. This method enables a signal to be transmitted between the pads and the sensor despite the resists around the pads.

Since, however, the non-contact sensor uses a sine-wave alternating current and must include filtering or include a wave detector to reduce the effects of noise, several tens of milliseconds are required to inspect a single printed pattern. Thus, if several thousand inspections are carried out for a single circuit board, several seconds are required to inspect the circuit board.

Another method for measuring a direct transient current in a non-contact manner to determine the acceptability of a printed pattern and which does not use a sine-wave alternating current is disclosed in Japanese Patent Application Laid Open No. 3-154879. This method eliminates the need for a wave detector, thereby somewhat reducing the inspection time.

As shown in FIG. 15A, the method connects terminals 20a and 20b of an inspection apparatus 20, a printed pattern 22, and a reference potential surface 24 formed to ensure insulation from the printed pattern 22, respectively, and applies a direct current to the terminal 20a for inspection. That is, the method determines the acceptability of the printed pattern 22 based on a transient current flowing through a capacitor formed between the printed pattern 22 and the reference potential surface 24. If, however, the printed pattern 22 is open-circuited at a position remote from the terminal 20a, as shown in FIG. 15A, the method may fail to detect the open circuit. In addition, if both printed patterns 22a and 22b are open-circuited and short-circuited, the method may also fail to detect this condition.

In addition to the forgoing and due to the need to examine the capacity of the capacitor between the printed pattern 22 and the reference potential surface 24 as well as a steady-state current flowing between the terminals 20a and 20b, the method must wait for a capacitor with a relatively large capacity to be almost fully charged. This of course prevents significant reduction in inspection time.

It is a general object of the present invention to provide an inexpensive and reliable circuit board inspection apparatus and method that can be applied to a circuit board with high density wiring.

SUMMARY OF THE INVENTION

A constant voltage is applied to a first switch section from a signal source, and a computer turns on a second switch section and then turns the first switch section on. An equivalent circuit is then closed to cause a current to flow therethrough, thereby generating a voltage that is input to an amplifier. After the voltage has been amplified, its maximum value is detected and held by a peak hold circuit. Based on the maximum value, the computer determines the continuity of a printed pattern on a circuit board. The voltage input to the amplifier exhibits the maximum value nearly simultaneously with the activation of the second switch section SW1. Thus, detection of the maximum value and continuity of the printed pattern can be determined in a very short time.

TERMINOLOGY

According to the present invention, the term "circuit board" refers to a substrate on which wiring can be or has been formed and is not limited in terms of its material, structure, shape or size. The circuit board may comprise for example, a glass epoxy circuit board, a film-like circuit board, and a package on which elements such as CPU's are mounted. It may also include a composite circuit board comprising sockets on a glass epoxy circuit board and a circuit board on which circuit elements are mounted.

The term "wiring" refers to an electrical conductor and is not limited in terms of its material, structure, shape, or size. The term includes printed patterns, through-holes, and pins formed on a circuit board as well as the conducting portion of electric cords, sockets, connectors, and discrete pins attached to the circuit board.

The term "one end of the wiring" or "the other or opposite end of the wiring" refers to a point of the wiring to or from which an inspection signal is input or output and is not limited in terms of its material, structure, shape, or size. The term includes an electric connection point to which a different component is connected such as an inspection-end or a connector-connection-end of a printed pattern, a connection pin, a pad to which a bonding wire is connected, a pad to which a circuit element or socket is connected, an insertion portion formed in a socket mounted on a circuit board, and an I/O end of a connector, as well as any arbitrary point within the wiring.

The term "coupling" refers to connecting two or more members together so that a signal can be transmitted among the members while they are insulated from one another. The term includes coupling by means of electrostatic capacity or inductance.

The term "signal" refers to a signal used for inspection and includes either a voltage or a current. It also includes alternating signals such as sine waves, a direct signal, rectangular and triangular signals, and pulse signals.

The expression "based on a voltage generated between the first and the second terminals" means something based on a voltage generated between first and second terminals or a physical quantity corresponding to or associated with the voltage. Thus, the physical quantity includes not only the voltage per se but also a current corresponding to or associated with the voltage, as well as its integrated and differential values.

The term "detection of continuity of the wiring" includes detection of an open circuit or shorting in the wiring and detection of the resistance value of the wiring such as a semi-open-circuit.

The term "group" refers to a set of one, two or more elements.

The term "signal with rapid changes" refers to a signal such as a voltage or current subjected to frequent changes per unit time, and includes for example, a direct signal having a step-like rising or falling edge, triangular and rectangular signals, and pulse signals.

The term "electrode section" refers to a conductor constituting an electrode on the second electrode side when electrostatic capacity is used for coupling and is not limited in terms of its material, structure, shape or size.

DETAILED DESCRIPTION OF THE PREFERRED EMBODIMENTS

Figure 1:
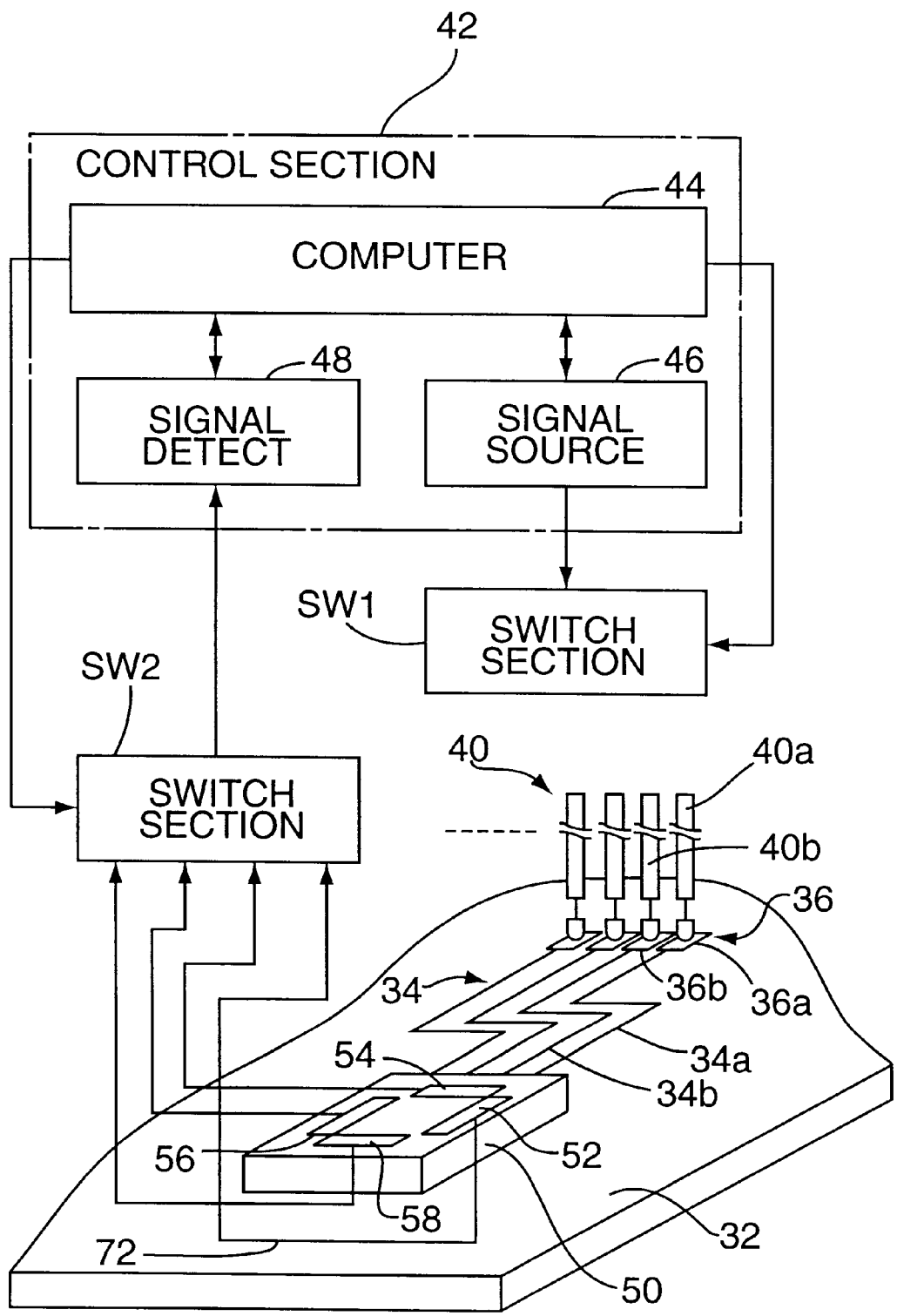
FIG. 1 schematically illustrates a bare-board tester forming a circuitboard inspection apparatus according to one embodiment of the present invention.

FIG. 1 illustrates a bare board tester or circuit board inspection apparatus according to one embodiment of the present invention. The bare board tester inspects the continuity of printed patterns on a circuit board (a bare board) before circuit elements are mounted on the board.

An example of an inspected circuit board comprises a plurality of printed patterns 34a, 34b, etc. formed on a circuit board 32 and collectively called a printed pattern section 34. Pads 36a, 36b, et sequa, are formed at one end of the printed patterns 34a, 34b, et sequa, and collectively called a pad section 36.

Figure 2:
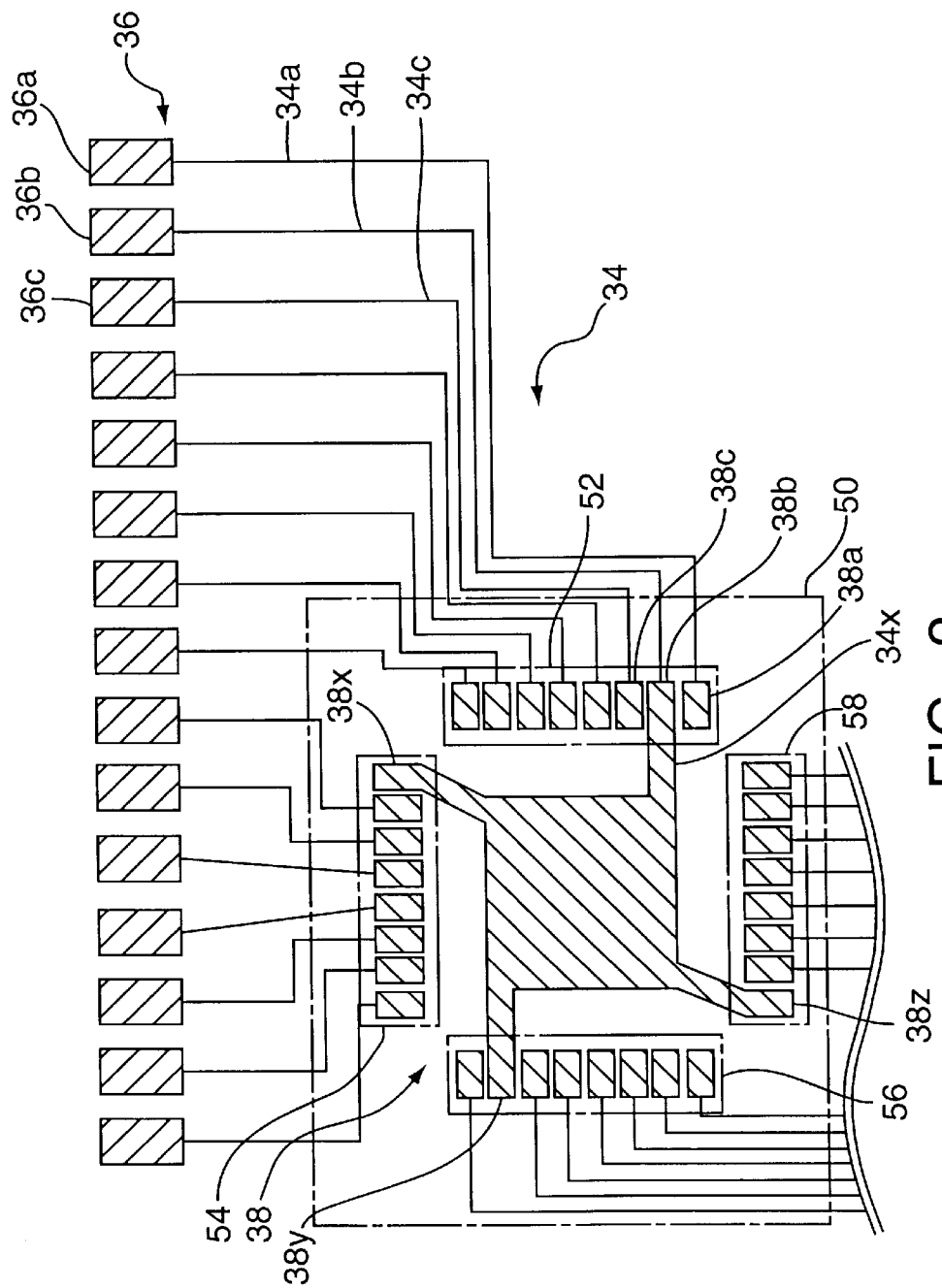
FIG. 2 is a detailed view of a printed pattern section 34 on a circuit board 32 to be inspected.
Figure 3A:
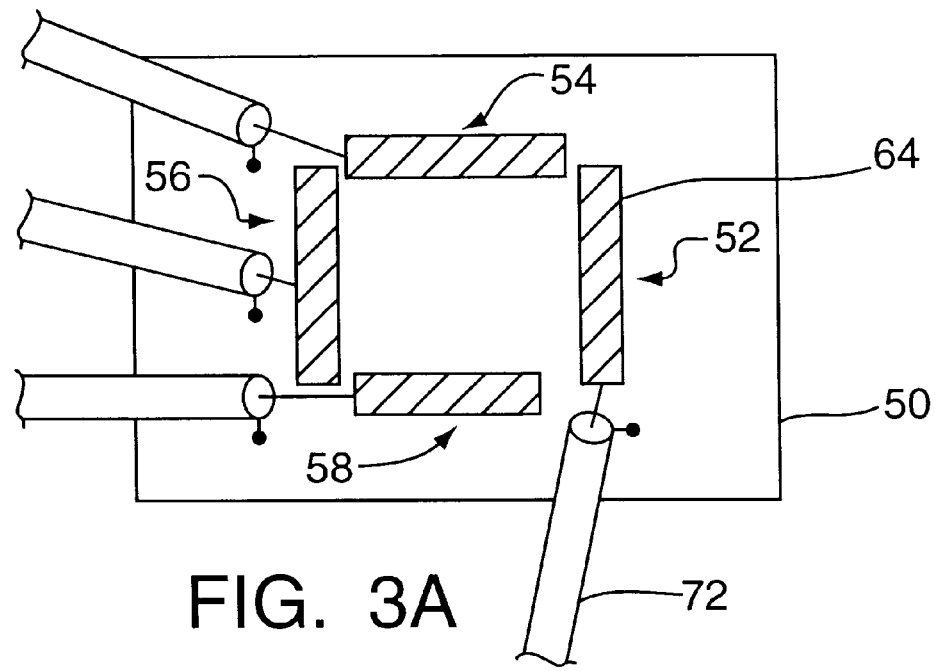
FIG. 3A is a plan view of a sensor module 50.
Figure 3B:
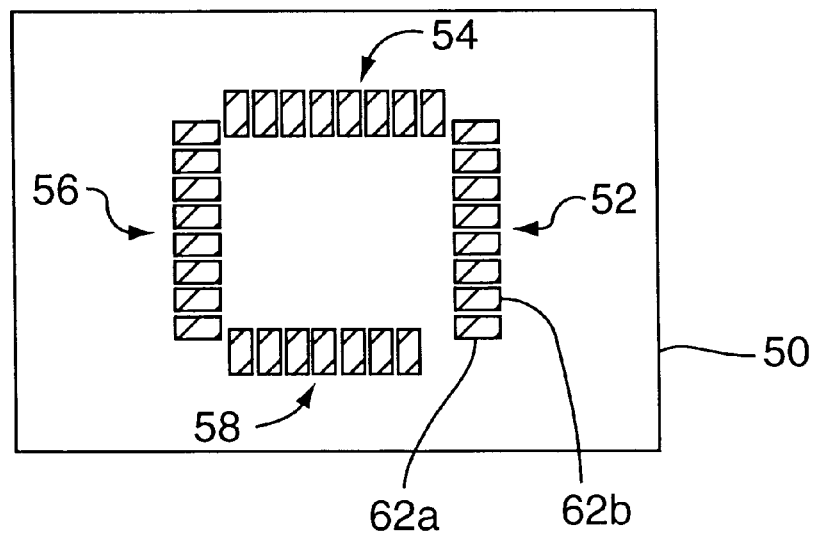
FIG. 3B is a view of the bottom surface of the sensor module 50.

FIG. 2 shows the printed pattern section 34 in detail. Pads 38a, 38b, et sequa, are formed at opposite ends of the printed patterns 34a, 34b, et sequa, and collectively called a pad section 38. The pad section 38 shown in FIG. 2 is called a QFP pattern on which QFP's (quad flat packages that are thin and roughly square) are mounted. Thus, the pitch at which the pads 38a, 38b, et sequa, are arranged is very small. In addition, in the QFP pattern, the pad 38b and the pads 38x, 38y and 38z are connected by printed pattern 34x to form a ground line.

Referring back to FIG. 1, the bare board tester includes probes 40a, 40b, et sequa, comprising a plurality of first terminals connected to the pads 36a, 36b, et sequa, on the circuit board 32. The plurality of probes 40a, 40b, et sequa, is collectively called a probe section 40.

Figure 7A:
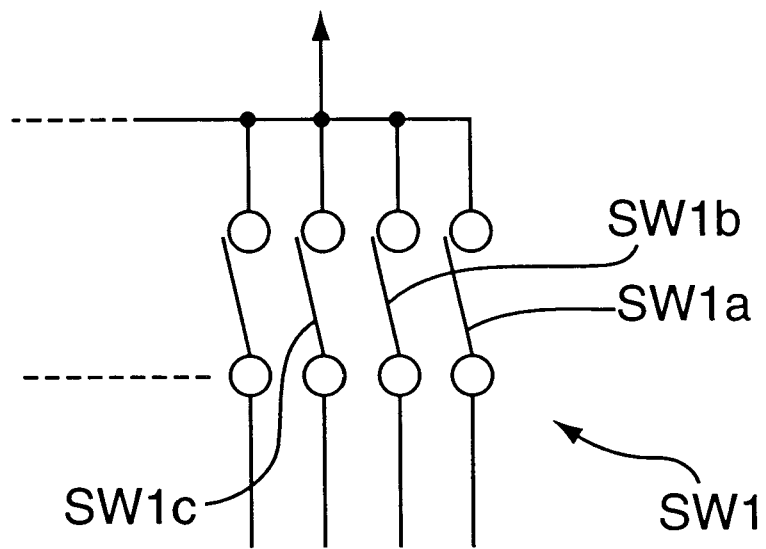
FIG. 7A schematically shows switch section SW1.

An inspection signal generated by a signal source 46 is delivered to a switch section SW1 comprising a first switch means. FIG. 7A schematically shows the switch SW1. The switch section SW1 includes a plurality of switches SW1a, SW1b, et sequa. Each switch is turned on and off in response to an instruction from a computer 44 to transmit a signal provided by the signal source 46 to a desired probe in the probe section 40, for example, the probe 40a, as shown in FIG. 1 (in this case, only the switch SW1a is turned on).

The signal transmitted to the probe 40a is provided to the pad 38a (see FIG. 2) of the pad section 38 via the pad 36a of the pad section 36 connected to the probe 40a and the printed pattern 34a in pattern section 34.

A sensor module 50 is also located on the pad section 38 on the circuit board 32. The sensor module 50 is coupled to the pad section 38 to obtain a signal from the pad section 38 and to supply it to a switch section SW2, a second switch means. The module 50 comprises a four sensor units 52, 54, 56, and 58 integrally formed as shown in FIGS. 1, 2, 3A and 3B. Each sensor unit corresponds to a second terminal. According to this embodiment, the sensor module 50 is comprised of a circuit board 60 (see FIG. 4B) manufactured through a process similar to the inspected circuit board 32.

Figure 4A:
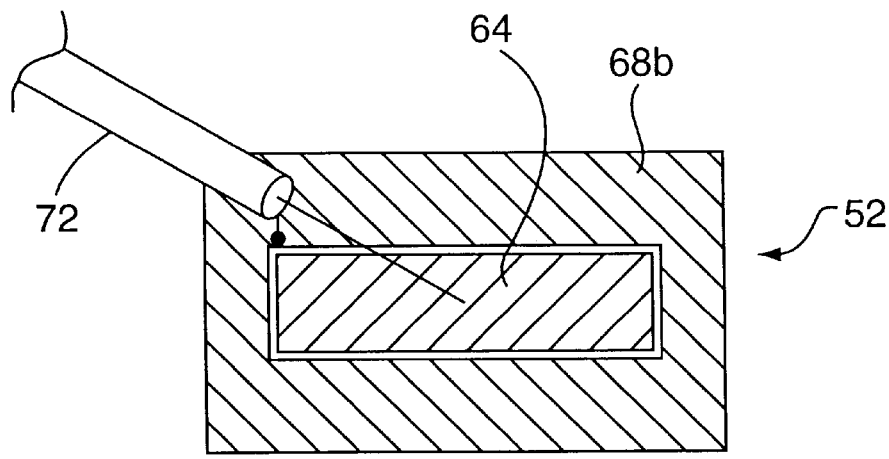
FIG. 4A is a plan view schematically illustrating an integral part of the sensor unit 52.
Figure 4B:
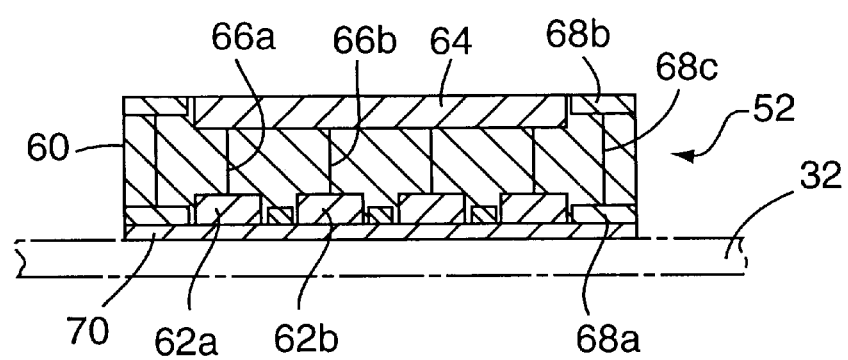
FIG. 4B is a cross-sectional view schematically illustrating a sensor unit 52.
Figure 4C:
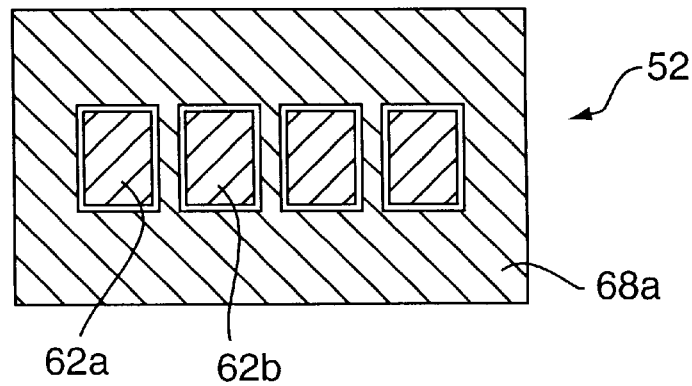
FIG. 4C is a bottom view schematically showing the sensor unit 52.

FIGS. 4A, 4B and 4C schematically show the sensor unit 52 constituting part of the sensor module 50. In the example in FIG. 2, the sensor unit 52 corresponds to the eight pads 38a, 38b, et sequa, (these eight pads form one group) but is shown to correspond to four pads in FIGS. 4A, 4B and 4C for ease of understanding and convenience of explanation. As shown in FIGS. 4B and 4C, electrode plates 62a, 62b, et sequa, constituting an electrode section are independently provided on the bottom surface of the circuit board 60. An insulating film 70 is formed to cover the electrode plates 62a, 62b, et sequa.

Electrode plates 62a, 62b, et sequa, are located opposite pads 38a, 28b, et sequa, (see FIG. 2) of the pad section 38 of the inspected circuit board 32 which are in turn located to correspond to the sensor unit 52 so as to form a group. Each electrode plate is designed with substantially the same shape as each pad. Thus, for example, electrode 62a and insulating film 70 of the sensor unit 52 and the pad 38a of the inspected circuit board 32 form a capacitor. This is also true of the other electrode plates 62b, et sequa.

As shown in FIGS. 4B and 4A, a connection plate 64 that is a conducting section is provided on the top surface of the circuit board 60. The connection plate 64 is electrically connected to the electrode plates 62a, 62b, et sequa, via through-holes 66a, 66b, et sequa. Thus, the connection plate 64 of the sensor unit 52 is capacitively coupled to the group of pads 38a, 38b, et sequa, described above. As shown in FIG. 4A, the connection plate 64 is connected to the switch section SW2 via a connection cord 72, FIGS. 3A and 4A. The connection plate 64 and the through-holes 66a, 66b, et sequa, correspond to connection means.

In addition, as shown in FIGS. 4A, 4B, and 4C, films 68a and 68b, or shield members, are formed on the bottom and top surfaces of the circuit board 60 and connected to each other via through-hole 68c. A ground potential is applied to the shield films 68a and 68b.

The sensor units 54, 56, and 58 (see FIGS. 2, 3A and 3B) constituting the other parts of the sensor module 50 have a similar configuration.

Figure 7B:
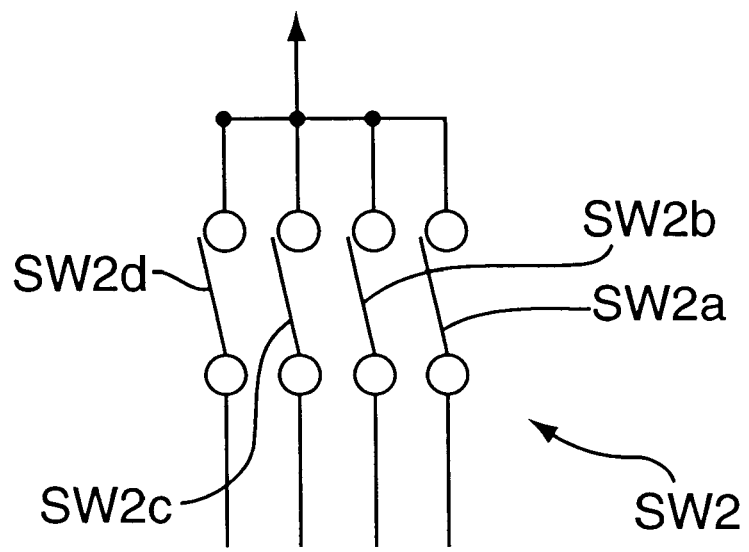
FIG. 7B schematically shows switch section SW2.

FIG. 7B schematically shows switch section SW2 as comprising four switches SW2a, SW2b, SW2c, and SW2d. Each switch is turned on and off in response to an instruction from computer 44 (see FIG. 1) to supply a signal detection section 48 with a signal from a desired one of the four sensor units 52, 54, 56, and 58 constituting the sensor module 50 (in this case, only the switch SW2a is turned on), for example, the sensor unit 52.

The signal provided by the desired sensor unit 52 is subjected to predetermined processing in the detection section 48, as shown in FIG. 1, and then delivered to the computer 44. Based on the transmitted signal, the computer 44 determines the continuity of a printed pattern selected by the switch sections SW1 and SW2 (in the above example, the printed pattern 34a). As will be seen, computer 44, signal source 46, and signal detection section 48 constitute a controller 42.

By designing the sensor module 50 of the four sensor units 52, 54, 56, and 58 so that a signal can be independently obtained from each sensor unit in this manner, the following advantages can be achieved. As described above, in the pad section 38 (the QFP pattern) of the printed pattern section 34 shown in FIG. 2, the pad 38b and the pads 38x, 38y, and 38z are connected together by the printed pattern 34x to form a ground line. Thus, by using the switch section SW1 to select the pad 36b and using the switch section SW2 to select the sensor unit 54 in order to inspect continuity, it can be determined whether the printed pattern 34x is open-circuited between the pad 38b and the pad 38x.

By designing the sensor module of the plurality of sensor units so that a signal can be independently obtained from each sensor unit, complicated or irregular printed patterns can thus be inspected accurately.

Figure 5A:
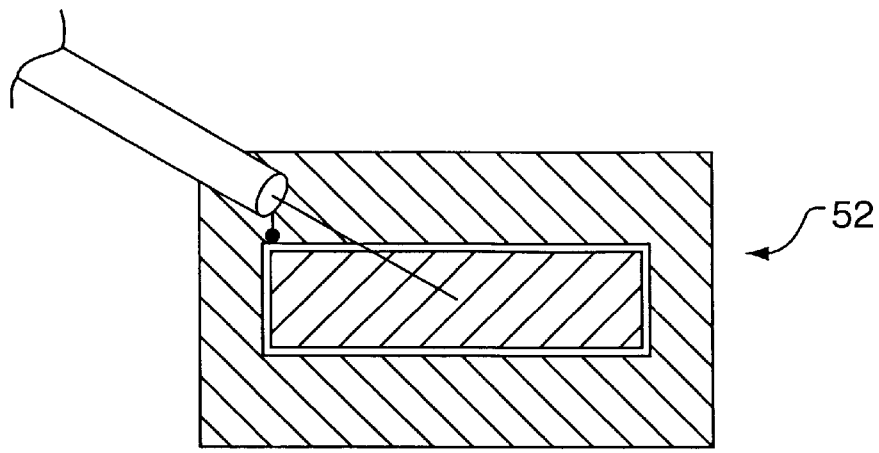
FIG. 5A is a plan view schematically showing a sensor unit 52 according to another embodiment.
Figure 5B:
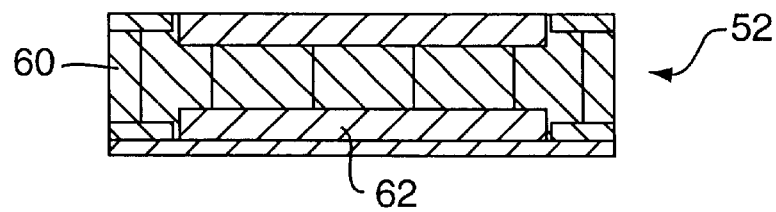
FIG. 5B is a cross-sectional view schematically showing an integral part of sensor unit 52.
Figure 5C:
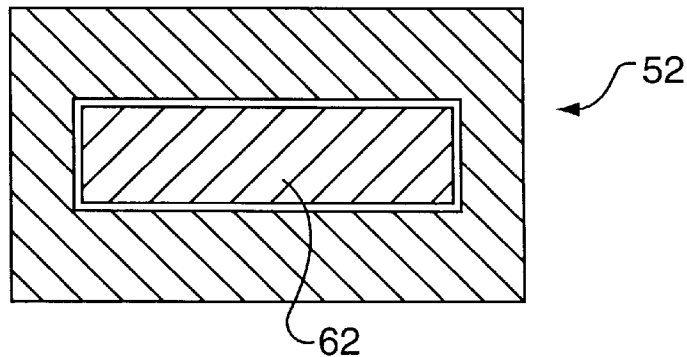
FIG. 5C is a bottom view schematically showing the sensor unit 52.
Figure 6A:
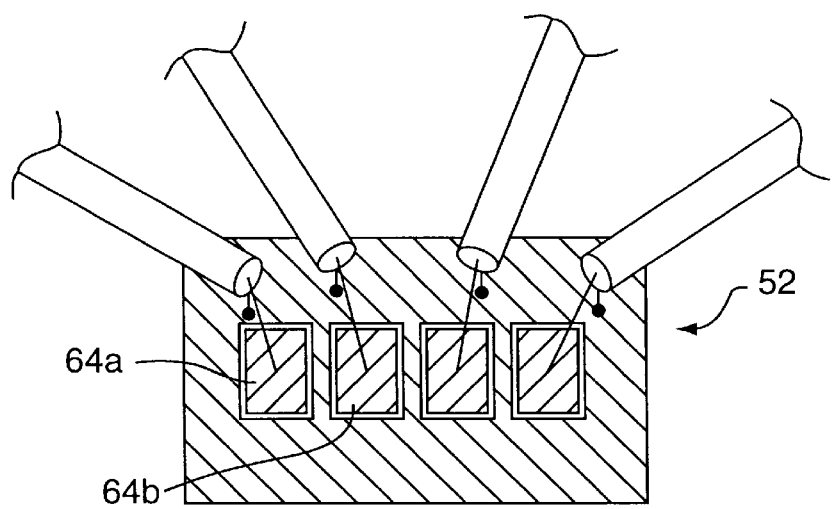
FIG. 6A is a plan view schematically showing a sensor unit 52 according to yet another embodiment.
Figure 6B:
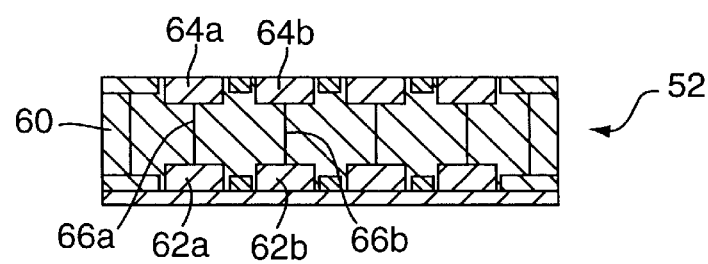
FIG. 6B is a cross-sectional view schematically showing an integral part of the sensor unit 52.
Figure 6C:
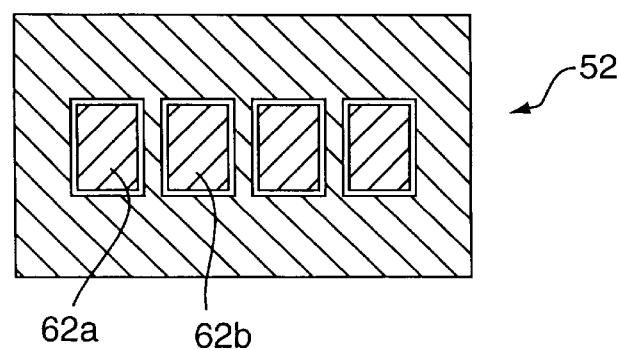
FIG. 6C is a bottom view schematically showing the sensor unit 52.

Although the above embodiment provides the plurality of electrode plates 62a, 62b, et sequa, on the bottom surface of the circuit board 60 of the sensor unit 52, as shown in FIGS. 4B and 4C, a single large electrode plate 62 may be provided on the bottom surface of the circuit board 60 as shown in FIGS. 5A, 5B, and 5C. That is, the single large electrode plate 62 of the sensor unit 52 is coupled to the group of pads 38a, 38b, et sequa, (see FIG. 2) corresponding to the sensor unit 52. This configuration is advantageous because the variation in the electrostatic capacity generated between the electrode plate 62 and the group of pads 38a, 38b, et sequa, shown in FIG. 2 is relatively small, even if the components are somewhat roughly aligned with one another.

The above embodiment connects the plurality of electrode plates 62a, 62b, et sequa, to the single connection plate 64 to allow all of the plurality of pads 38a, 38b et sequa, corresponding to the sensor unit 52 shown in FIG. 2 to be subjected to a single signal processing step as shown in FIGS. 4B and 4A. A plurality of connection plates 64a, 64b, et sequa, may be provided on the top surface of the circuit board 60 and connected to the electrode plates 62a, 62b, et sequa, respectively, via the through-holes 66a, 66b, et sequa, to obtain a signal from the connection plates 64a, 64b, et sequa. This configuration allows the plurality of pads 38a, 38b, et sequa, shown in FIG. 2 to be individually subjected to signal processing and accommodates more delicate processing to allow the apparatus to inspect more complicated printed patterns. In this case, the pads 38a, 38b, et sequa, individually form a group, that is, each group is composed of only a single pad.

In addition, although the above embodiment integrates the four sensor units 52, 54, 56, and 58 into the sensor module 50, these sensor units may be separately formed. The integration, however, allows the plurality of sensor units to be handled easily compared to separate units. In addition, the integral sensor module 50 can be more efficiently positioned on the circuit board 32.

Figure 8:
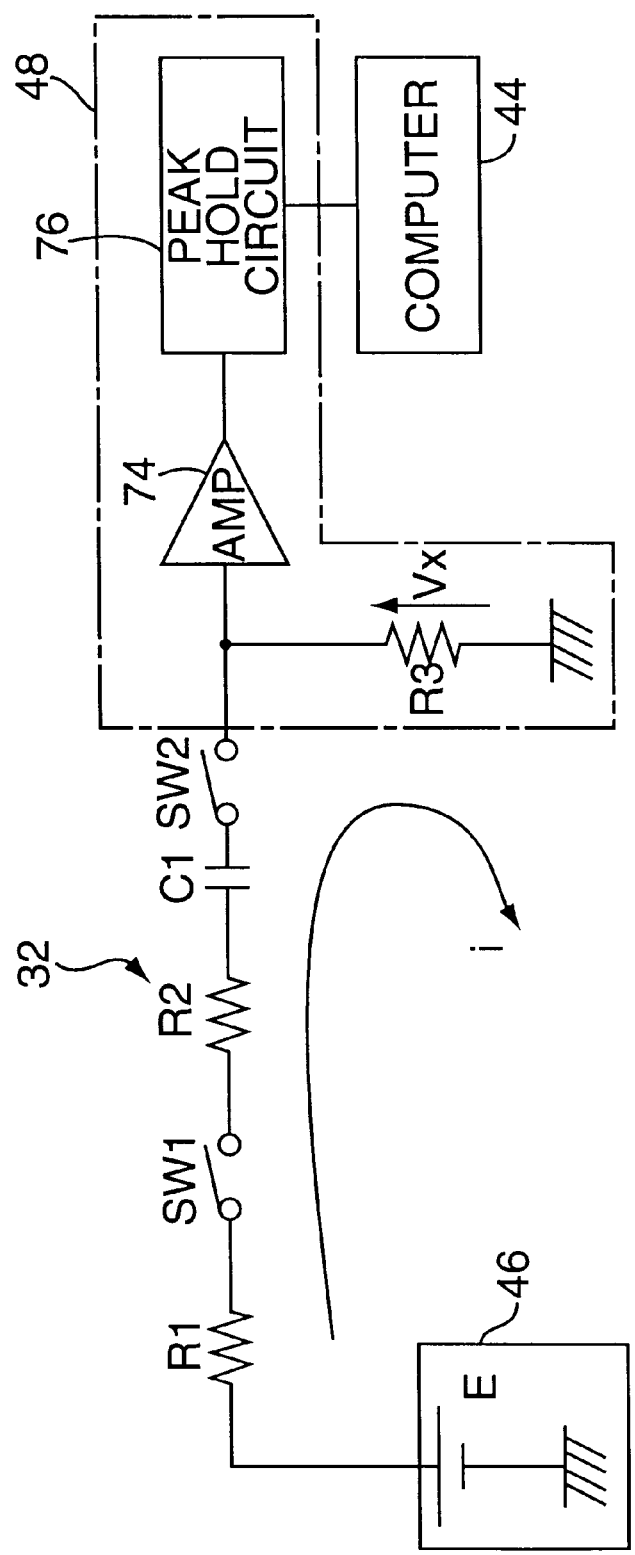
FIG. 8 schematically illustrates signal processing.
Figure 9:
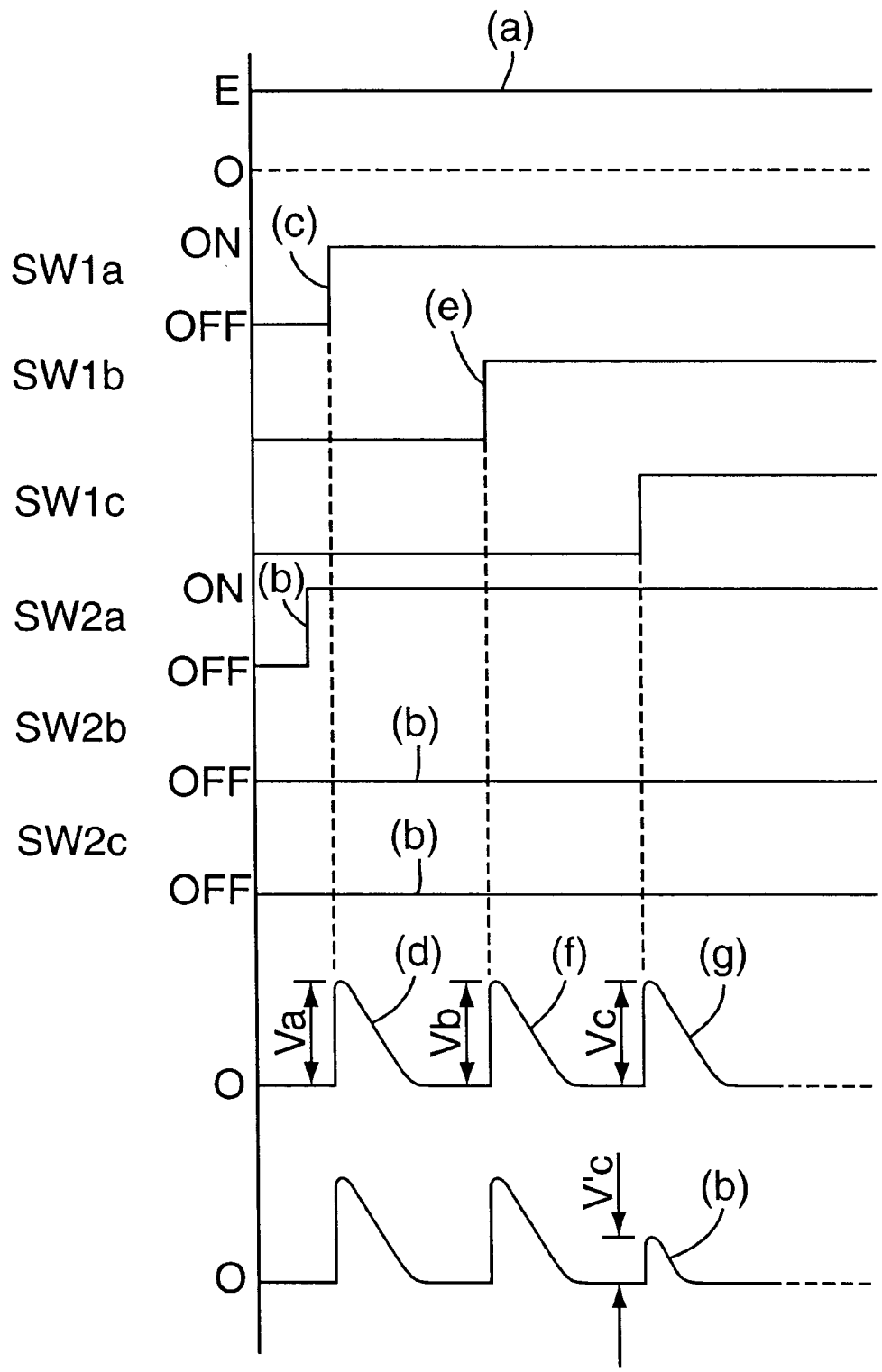
FIG. 9 is a timing chart of signal processing.

The signal processing executed by the bare-board tester shown in FIG. 1 will now be described. As stated above, FIG. 8 shows an equivalent circuit used for signal processing while FIG. 9 is a timing chart for the signal processing. The signal processing executed by the bare-board tester will be described with reference to FIGS. 1, 8 and 9. For the sake of convenience, FIG. 9 omits the description of certain switches constituting the switch sections SW1 an SW2. A constant-voltage source is employed as the signal source 46 (see (a) in FIG. 9). Thus, a constant voltage E is applied to the switch SW1 by the source 46, as shown in FIG. 1. The computer 44 first transmits an instruction to the switch section SW2 to turn on only the switch SW2a while turning off the other switches SW2b, SW2c, and SW2d ( see FIGS. 7B and (b) in FIG. 9). Thus, only the sensor unit 52 is connected to the signal detection circuit 48, whereas the other sensor units 54, 56, and 58 remain disconnected from the signal detection circuit 48. The computer 44 then sends an instruction to the switch SW1 to turn on only the switch SW1*a* (see (c) in FIG. 9) while turning off the other switches SW1*b*, SW1*c*, et sequa (see FIG. 7A). Now, only the probe 40*a* is connected to the signal source 46, whereas the probes 40*b*, 40*c*, et sequa, remain disconnected from the signal source 46. This causes the printed pattern 34*a* on the circuit board 32 to be selected for inspection.

In FIG. 8, the resistor R1 represents the internal resistance of the switches SW1*a* and SW2*a*, and the resistor R2 represents the resistance of the printed pattern 34*a* on the circuit board 32. The resistor R3 represents the ground resistance in the signal detection section 48. The capacitance C1 represents a capacitor formed of the electrode plates 62*a*, 62*b*, et sequa, of the sensor unit 52, the insulating film 70 (FIG. 4B), and the pads 38*a*, 38*b*, et sequa, corresponding to the sensor unit 52. The letter E represents the direct voltage from the signal source 46.

When the switch 1*a* is turned on (see (c) in Fog. 9), the equivalent circuit shown in FIG. 8 is closed to allow a current (i) as shown below to flow.

$$i = E/(R1+R2+R3) \exp(-\alpha t)$$

wherein $$\alpha = 1/\{(R1+R2+R3) \cdot C1\} \quad (1)$$

Thus, the input voltage Vx into an amplifier 74 is as follows:

$$Vx = R3i = R3/(R1+R2+R3) \cdot E \cdot \exp(-\alpha t)$$

wherein $$\alpha = 1/\{(R1+R2+R3) \cdot C1\} \quad (2)$$

After the voltage Vx has been amplified by the amplifier 74, a peak hold circuit 76 detects and holds its maximum value (corresponding to the voltage Va in (d) in FIG. 9). The peak hold circuit 76 includes a D/A converter (not shown) that digitalizes and transmits the maximum value to the computer 44. Part of the function of the peak hold circuit 76 can be implemented by the computer 44. Based on the maximum value, the computer 44 determines the continuity of the printed pattern 34*a* on the circuit board 32. For example, it makes a determination by checking whether the maximum value is between the upper and lower reference limits. As is apparent from Equation (2), the voltage Vx input to the amplifier 74 causes the maximum value Va (=R3/(R1+R2+R3)*E) to be exhibited at almost the exact same time that the switch SW1*a* is turned on (see (d) in FIG. 9). Thus, the peak hold circuit 76 can finish detecting the maximum value in a very short time. This enables the continuity of the printed pattern to be determined in a very short time and as a result, operation is unlikely to be affected by noise.

The computer 44 then transmits an instruction to the switch SW1 to turn the switch SW1*b* on (see (e) in FIG. 9). She switch SW1*a* remains on. Thus, the probes 40*a* and 40*b* are connected to the signal source 46. In this case, the condition of the switch section SW2 remains unchanged.

As described above, the voltage Vx input into the amplifier 74 exhibits a maximum value Vb (see (f) in FIG. 9) at almost the exact same time that the switch SW1*b* is turned on (see (e) in FIG. 9). The computer 44 determines the continuity of the printed pattern 34*b* on the circuit board 32 based on the maximum value Vb, as described above.

Although the printed pattern 34*a* on the substrate 32 is selected together with the printed pattern 34*b*, the capacitor C1 (see FIG. 8) in the equivalent circuit formed of the printed pattern 34*a* is almost fully charged (the timing with which the switch SW1*b* is turned on is set to provide this condition). Thus, virtually no current (i) flows through the printed pattern 34*a*. Consequently, the voltage Vx input to the amplifier 74 is provided only by the current (i) flowing through the printed pattern 34*b*.

In this embodiment, as described above, the sensor module 50 is composed of the plurality of sensor units 52, 53, et sequa, (see FIGS. 2, 3A and 3B), each of which is coupled to the corresponding group of pads via the separate capacitor. Thus, the electrostatic capacity of each capacitor C1 is relatively small. That is, shown in Equation (1) has a relatively large value (that is, the time constant has a corresponding small value). Thus, the time (t) required until the current (i) almost reaches zero is short, as is apparent from Equation (1). This embodiment can thus determine the continuity of the printed patterns in short cycles.

The computer 44 then switches sections SW1 and SW2 as required to inspect the continuity of the printed patterns 34*c*, et sequa. The circuit board 32 is acceptable, as shown in FIG. 9, that is, if the printed patterns 34*a*, 34*b*, 34*c* et sequa, are not open-circuited, the voltage Vx input to the amplifier 74 is as shown in (d), (f), (g), et sequa, respectively.

On the other hand, if the circuit board 32 is unacceptable, the printed pattern 34*c* for example being open-circuited, then the voltage Vx input to the amplifier 74 has a very small maximum value V'c, as shown in (h), thereby causing the unacceptability of this circuit board to be readily determined. This is also indicated in Equation (2), wherein Vx=0 is established regardless of the time (t) if the resistor R2 representing the resistance of the printed pattern has an infinite value ( a fully open circuit). This embodiment allows the continuity of the printed pattern to be inspected both expeditiously and accurately.

Although this embodiment turns on the switch SW1*b* while keeping the switch SW1*a* on (see (c) and (e) in FIG. 9), the switch SW1*a* may be turned off immediately after the peak hold circuit 76 has finished detecting the maximum value for the printed pattern 34*a* (the maximum value corresponding to the voltage Va), followed by the turning-on of the switch SW1*b*. This configuration eliminates the need to wait for the current (i) flowing through the printed pattern 34*a* to reach almost zero before starting to inspect the next printed pattern 34*b*. Thus, the continuity of the printed patterns can be inspected in shorter cycles. This configuration also prevents the length of the inspection cycle from being significantly increased even if the time constant (the inverse of $\alpha$ in Equations (1) and (2)) is large.

In addition, although the above embodiment uses the constant-voltage source as the signal source 46 (see (a) in FIG. 9) and turns each switch of the switch section SW1 on and off (see (c) and (e) in FIG. 9) to obtain a voltage with a step-shaped waveform and sharp rising edges, a circuit which sequentially generates signals with rapid changes may also be used as the signal source 46.

Figure 10:
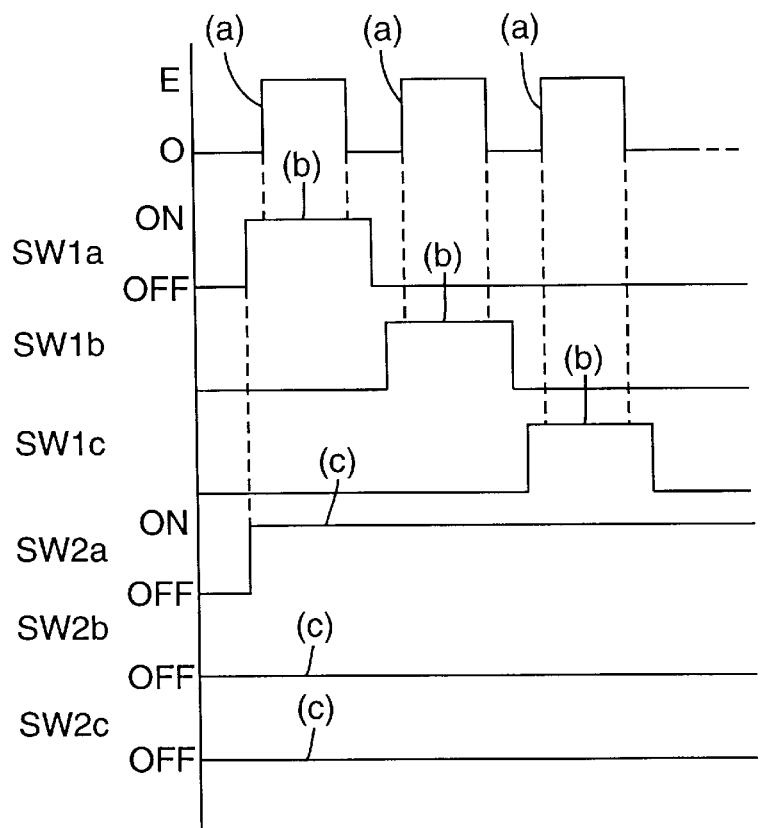
FIG. 10 is a timing chart showing another example of signal processing.

FIG. 10 shows a timing chart of signal-processing executed when the signal source 46 described above is used. This example employs a rectangular-wave generation circuit as the signal source 46. By activating the switch SW1 or SW2 almost in synchronism with the phase of the rising edge of each rectangular signal (see (a) in FIG. 10), the computer 44 distributes among the printed patterns 34*a*, 34*b*, et sequa, each rectangular signal sequentially generated by the signal source 46 (FIG. 11). The condition of the voltage Vx input to the amplifier 74 and the processing executed after it has been input to the amplifier 74 are similar to those in the example shown in FIG. 9.

Figure 11A:
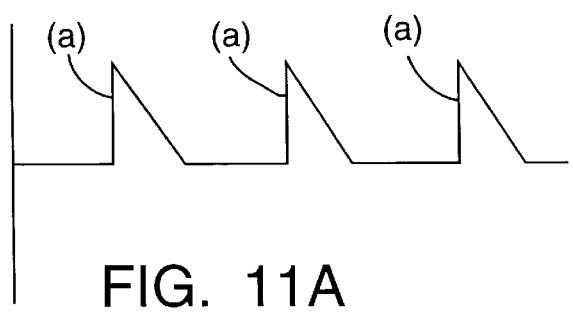
FIG. 11A shows a signal output from a source 46 in the example of FIG. 10.
Figure 11B:
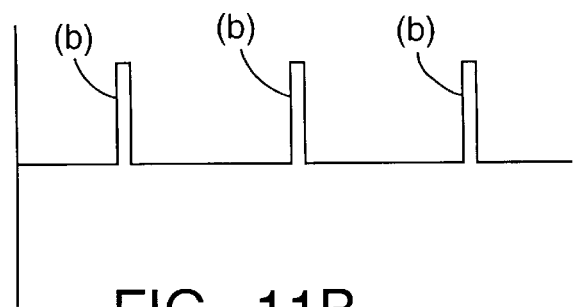
FIG. 11B shows a signal output from signal source 46 in yet another example.

Although in the example shown in FIG. 10, the signal source 46 generates rectangular waves, the source 46 may also be configured to generate triangular waves as shown in FIG. 11A. Each triangular wave has sharp rising edges (a). Further, the signal source 46 may be configured to generate a pulse train as shown in FIG. 11B, each pulse signal having sharp rising edges (b), as above in FIG. 11A.

Signals having sharp rising edges are not limited to those described above and my include not only those taking no time to rise but also those taking minimal time to rise as well as signals having sharp falling edges.

Although the above embodiment determines the continuity of the wiring based on the maximum voltage generated at the second terminal after the signal has changed rapidly, the invention is not so limited. The invention may be configured to determine the continuity of the wiring based on other parameters relating to the voltage generated between the first and second terminals when a signal with rapid changes is applied, such as the average of the voltage within a specified period of time, the voltage value obtained after a specified period of time, the steady-state deviation voltage, or the maximum, average, or integral value of the current flowing between the first and second terminals, all values obtained after the signal has changed rapidly. Continuity of the wiring, however, can be determined in a minimum time employing the maximum voltage as in the above embodiment.

Although the above embodiment has been described in conjunction with the sensor module composed of the plurality of second terminals (the sensor units 52, 54, 56 and 58), the invention is also applicable to a sensor module consisting of a single second terminal.

Figure 12:
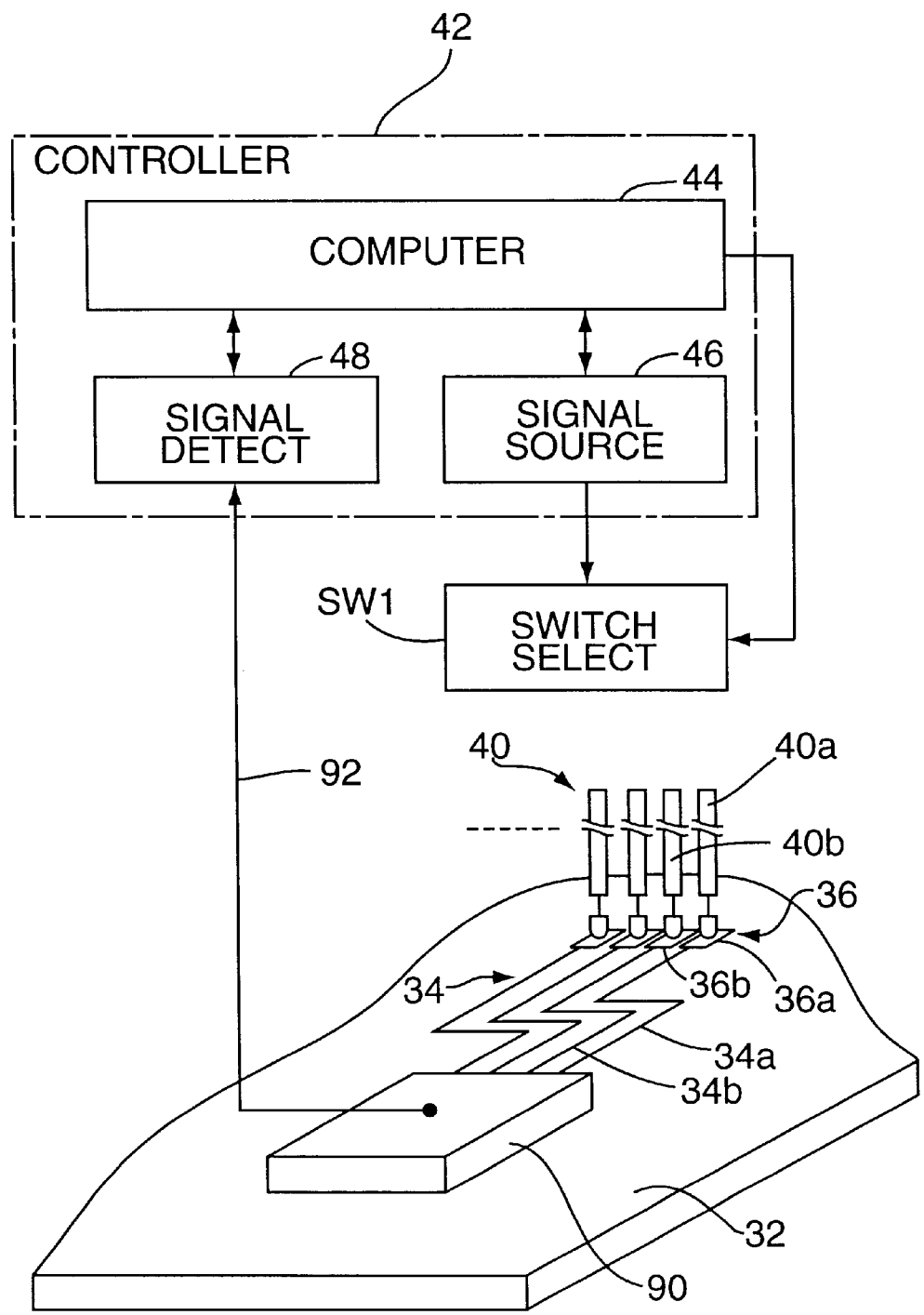
FIG. 12 schematically illustrates the configuration of an inspection apparatus according to another embodiment of the present invention.
Figure 13A:
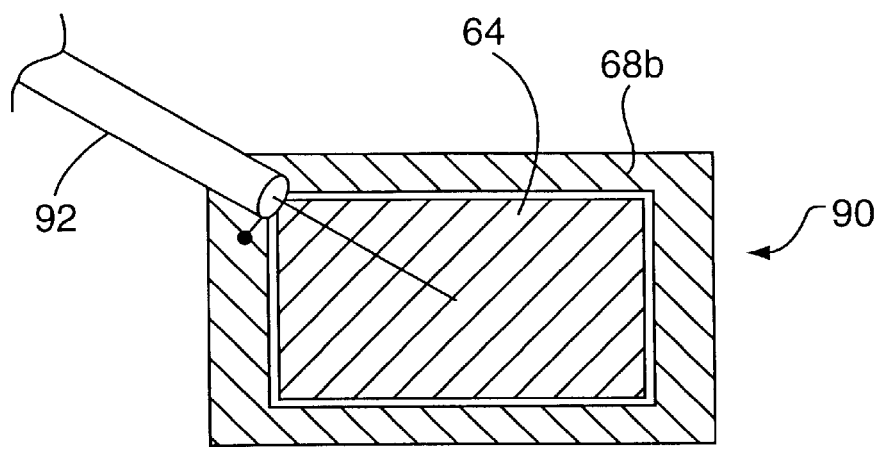
FIG. 13A is a plan view of a sensor module 90.
Figure 13B:
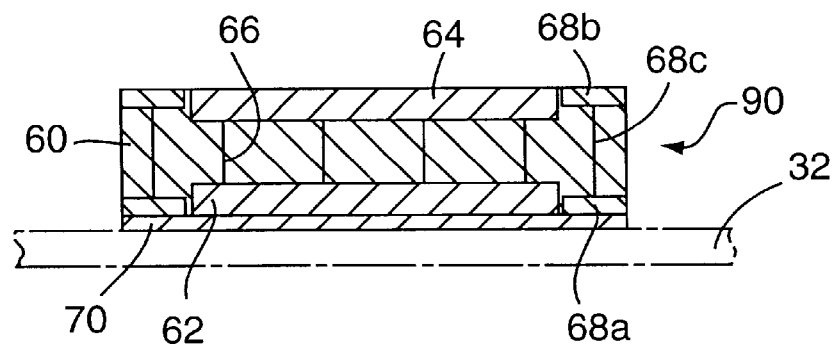
FIG. 13B is a cross sectional view of an integral part of the sensor module 90.
Figure 13C:
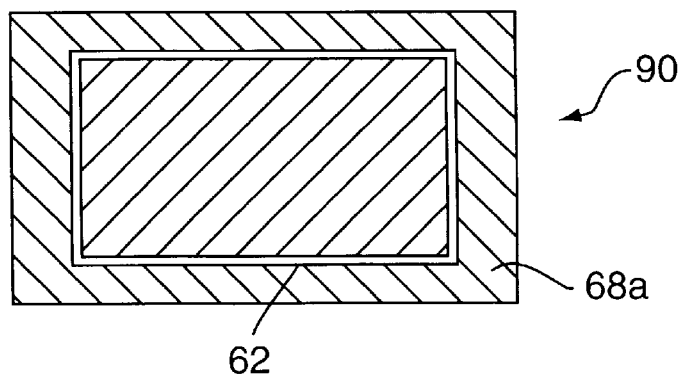
FIG. 13C is a bottom view of the sensor module 90.
Figure 14:
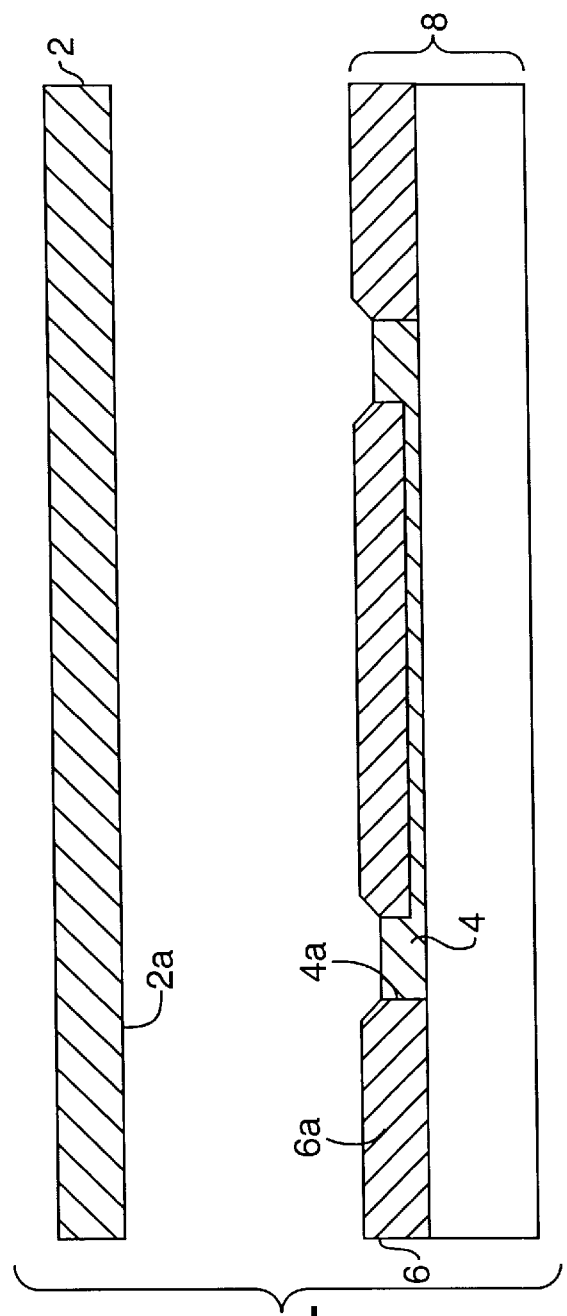
FIG. 14 illustrates a conventional PRIOR ART inspection apparatus of the continuity of printed patterns.
Figure 15A:
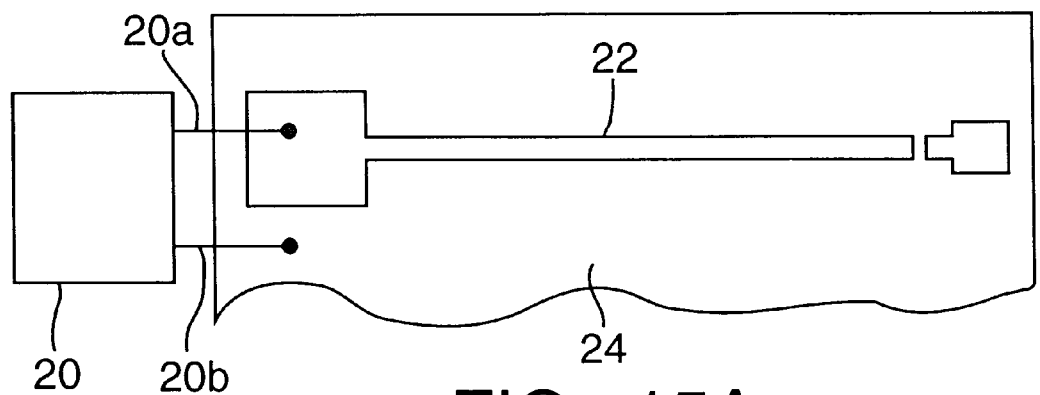
FIG. 15A illustrates another example of a conventional PRIOR ART inspection apparatus of the continuity of printed patterns.
Figure 15B:
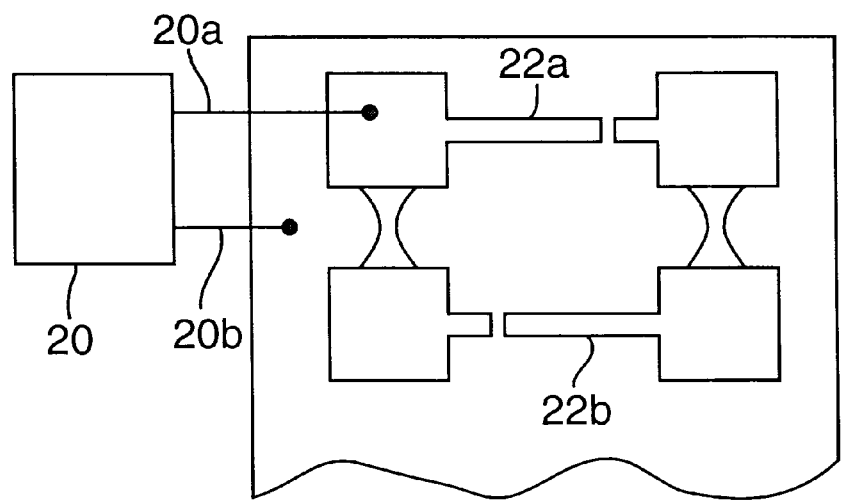
FIG. 15B illustrates yet another example of a conventional PRIOR ART inspection apparatus o the continuity of printed patterns.

FIG. 12 illustrates a configuration of a bare-board tester that uses a sensor module 90 composed of a single second terminal. The configurations of the controller 42, the switch section SW1, and the probe section 40 are similar to those in the bare-board tester shown in FIG. 1. The bare-board tester shown in FIG. 12, however, has only one output from the sensor module 90. Thus, it does not include the switch SW2 that switches the output from the sensor module 50 to supply it to the signal detection section 48, as in FIG. 1. The sensor module 90 disposed on the pad section 38 (see FIG. 2) of the circuit board 32 is coupled to the pad section 38 to obtain a signal therefrom in order to deliver the same directly to signal detection section 48. FIGS. 13A, 13B and 13C show the configuration of sensor module 90. The module is composed of a circuit board 60 (see FIG. 13B) manufactured through a process similar to that for the inspected circuit board 32 as in the above embodiment. As shown in FIGS. 13B and 13C, one electrode plate 62 forming the electrode section, is provided on the bottom surface of the circuit board 60, with an insulating film 70 formed to cover the plate 62. The plate is disposed opposite to the pad section 38 of the inspected circuit board 32 and is capacitively coupled to all of the pads 38a, 38b, et sequa, (see FIG. 2) in the pad section 38 via the insulating film 70.

This configuration is convenient because the variation in electrostatic capacity generated between the electrode plate 62 and the pads 38a, 38b, et sequa, shown in FIG. 2 is relatively small even if the plate is only roughly aligned with the pads.

A connection plate 64 is also provided on the top surface of the circuit board 60, as shown in FIGS. 13A and 13B. The connection hole 64 is electrically connected to the electrode plate 62 via a through-hole 66. The connection plate 64 is connected to the signal detection section 48 via a cord 92. In addition, in FIGS. 13A, 13B and 13C, shield films 68a and 68b, or shield members , are formed on the bottom and the top surfaces of the circuit board 60, respectively, and are connected to each other via through-hole 68c. The shield films 68a and 68b are provided with ground potential.

The signal processing executed by the bare-board tester of FIG. 12 is almost the same as that of the bare-board tester of FIG. 1. The tester shown in FIG. 12, however, does not execute processing for the switch section SW2, as described above.

Part or all of the functions of the computer 44 shown in FIG. 1 can also be implemented using hardware logic. In addition, part or all of the functions of the signal source 46 or the signal detection section 48 can also be implemented using the computer.

Although the above embodiment disposes shield members around the electrode section, the shield members may be eliminated, use of the members, however, serving to reduce noise.

In addition, the second terminal insulating film covering the electrode section, may be eliminated. By providing the film, however, inspections can be conducted promptly, as the need to prepare separate insulating films prior to inspection is eliminated.

Further, although the above embodiment provides the electrode section on one side of the circuit board constituting the sensor module, while providing on he other side the connection-conducting section electrically connected to the electrode section, the connection-conducting section on the other side may be eliminated. By providing the connection-conducting section on the other side, however, the structure of the sensor module can be simplified, as a signal can be transmitted quite easily via this section.

Although in the above embodiment the sensor module is composed of a circuit board manufactured by a process similar to that used for the inspected circuit board, it may be made of a circuit board manufactured by a process dissimilar to that used for the inspected circuit board, or may be configured without any circuit board whatsoever. By manufacturing the sensor module by a process similar to that used for the inspected circuit board, however, if the density or complexity of the wiring on the inspected circuit board has been increased, the density or complexity of the sensor module can be conveniently increased correspondingly.

In addition, although in the above embodiments the second terminal is capacitively coupled to the other or opposite end of the wiring, it may instead be inductively coupled. Capacitive coupling, however, enables reliable inspections to be conducted using a very small configuration. Similarly, although the above embodiments connect the first terminal to one end of the wiring, the first terminal may be capacitively connected to one end of the wiring.

Although the above embodiments provide a plurality of first terminals and use the first switch means to select a desired first terminal in order to select one of the one ends of the wiring on the inspected circuit board, only one first terminal may be provided and the inspected circuit board may be moved relative to the first terminal to select one of the ends of the wiring. The former configuration, however, eliminates the need to move the inspected circuit board relative to the first terminal, thereby enabling inspections to be conducted very accurately, reducing the manufacturing cost of the apparatus, and allowing inspections to be easily automated.

Although the above embodiments have been described with the inspected circuit board having wiring with a plurality of other or opposite ends connected together, this invention is not limited to the inspection of such a circuit board.

Finally, although the above embodiments have been described with the bare-board tester, the invention is not limited to such a tester. Instead, the invention is applicable to general circuit-board inspection apparatus and methods, such as those in which a circuit board mounts elements such as CPU's or a package carrying circuit elements are mounted.

What is claimed is:

1. A printed circuit board inspection apparatus for inspecting conductivity of a plurality of electric paths printed thereon, each of the paths having a first terminal and a second terminal, the apparatus comprising:
  a plurality of contact probes, each of the contact probes being adapted to be in contact with and electrically connected with each of the first terminals of the paths;
  a signal generator for selectively supplying a test signal to one of the contact probes, the test signal changing its electric parameter rapidly;
  a sensing probe arranged to confront the second terminals of the paths with a gap therebetween to be electrically coupled with the second terminals for allowing the test signal to pass through the gap and picked up by the sensing probe;
  a detector for detecting the signal picked up by the sensing probe while the parameter of the signal is changing in one direction; and
  means for determining whether the detected signal is above or below a predetermined level.

2. A printed circuit board testing apparatus as claimed in claim 1, wherein said signal generator includes a voltage generator for generating a voltage signal of which voltage changes rapidly.

3. A printed circuit board testing apparatus as claimed in claim 2, wherein said voltage generator includes means for generating a voltage signal of which voltage rises rapidly, and the detector includes a peak hold circuit for holding the maximum of the voltage signal transmitted through the electric path and detected by the sensing probe.

4. A printed circuit board testing apparatus as claimed in claim 1, wherein said signal generator includes a voltage generator and a switch for selectively connecting the voltage generator to one of the contact probes.

5. A printed circuit board testing apparatus as claimed in claim 3 wherein said voltage generator includes a constant voltage source for generating a constant voltage, and the switch is arranged to alternatively and sequentially connect the constant voltage source to one of the contact probes.

6. A printed circuit board testing apparatus as claimed in claim 1 wherein said signal generator include a pulse generator for generating rectangular wave pulses and a switch for alternatively and sequentially connecting the pulse generator to one of the contact probes in synchronization with rising of each pulse.

7. A printed circuit board testing apparatus as claimed in claim 1, wherein said sensing probe includes an electrode plate covering a plurality of second terminals.

8. A printed circuit board testing apparatus as claimed in claim 7, further comprising an insulating film disposed in the gap.

9. A printed circuit board testing apparatus as claimed in claim 1, wherein said sensing probe includes a plurality of electrode plates each of which covers a plurality of the second terminals.

10. A printed circuit board testing apparatus as claimed in claim 1, wherein said sensing probe includes a plurality of electrodes each of which confronts to one of the second terminals.

11. A printed circuit board testing apparatus as claimed in claim 10, wherein said sensing probe further includes a connection plate connected to a plurality of electrodes.

12. A printed circuit board testing apparatus as claimed in claim 10, wherein said sensing probe further includes a plurality of connection plates respectively connected with corresponding electrodes.

13. A printed circuit board inspection apparatus for inspecting conductivity of a plurality of electric paths printed thereon, each of the paths having a first terminal pad connected to the first terminal of the wiring and a second terminal pad connected to the second terminal of the wiring, the second terminal pads being arranged in a plurality of groups, the apparatus comprising:
  a plurality of contact probes, each of the contact probes being adapted to be in contact with and electrically connected with each of the first terminal pads;
  a signal generator for selectively supplying a test signal to one of the contact probes;
  a plurality of sensing probes arranged such that each of the sensing probes respectively covers and confronts one of the groups of the second terminal pads with an insulating layer therebetween to be electrically coupled with the second terminal pads for allowing the test signal to pass through the insulating layer and picked up by the sensing probe;
  a detector for detecting the signal picked up by the sensing probe; and
  means for determining whether the detected signal is above or below a predetermined level.

14. A printed circuit board testing apparatus as claimed in claim 13, wherein the second terminal pads of each group align in a row, and each of said sensing probes includes an electrode plate covering the second terminal pads of its corresponding groups of second terminal pads.

15. A printed circuit board inspection apparatus for inspecting conductivity of a plurality of electric paths printed thereon, each of the paths having a first terminal and a second terminal, the apparatus comprising:
  a plurality of contact probes, each of the contact probes being adapted to be in contact with and electrically connected with each of the first terminals of the paths;
  a signal generator for selectively supplying a test signal to one of the contact probes, the test signal changing its electric parameter rapidly;
  a sensing probe arranged to confront to the second terminals of the paths with an electrically insulating layer therebetween to be electrically coupled with the second terminals for allowing the test signal to pass through the layer and picked up by the sensing probe;
  a detector for detecting a maximum value of the signal picked up by the sensing probe; and
  means for determining whether the detected signal is above or below a predetermined level.

16. A printed circuit board testing apparatus as claimed in claim 15, wherein said detector includes a peak hold circuit to detect the maximum value.

17. A printed circuit board inspection apparatus for inspecting conductivity of a plurality of electric paths printed thereon, each of the paths having a first terminal and a second terminal, the apparatus comprising:
  a plurality of contact probes, each of the contact probes being adapted to be in contact with and electrically connected with each of the first terminals of the paths;
  a signal generator for selectively supplying a test signal to one of the contact probes, the test signal rising and lowering its electric parameter in a short time;

a sensing probe arranged to confront the second terminals of the paths with an electrically insulating layer therebetween to be electrically coupled with the second terminals for allowing the test signal to pass through the layer and picked up by the sensing probe;

a detector for detecting the signal picked up by the sensing probe; and means for determining whether the detected signal is above or below a predetermined level.

18. A method for inspecting conductivity of a plurality of electric paths on a printed circuit board, each of the paths having a first terminal and a second terminal, the method comprising the steps of:

making a plurality of contact probes in contact with the corresponding first terminals of the electric paths;

electrically coupling a sensing probes with the second terminals through a gap;

alternatively and sequentially applying a test signal to each of the contact probes, the test signal changing its electric parameter rapidly;

detecting the test signal to be transmitted to the sensing probe via the electric path to which terminal the test signal is being applied, while the test signal making a rapid and simple change; and determining whether the detected signal is above or lower than a predetermined level.

19. A method for inspecting conductivity of a plurality of electric paths on a printed circuit board as claimed in claim 18, wherein the electric coupling is a capacitive coupling.

20. A method for inspecting conductivity of a plurality of electric paths on a printed circuit board as claimed in claim 18, wherein the electric coupling is an electromagnetic coupling.

21. A method for inspecting conductivity of a plurality of electric paths on a printed circuit board as claimed in claim 18, wherein the step of detecting includes a step of holding a maximum value in the transmitted signal.

22. A method for inspecting conductivity of a plurality of electric paths on a printed circuit board as claimed in claim 18 wherein the step of applying the test signal includes a step of sequentially and selectively connecting the contact probes with a voltage generator.

23. A method for inspecting conductivity of a plurality of electric paths on a printed circuit board as claimed in claim 18 wherein the step of applying the test signal includes a step of sequentially and selectively connecting the contact probes with a constant voltage source.

* * * * *